(12) United States Patent
Tomioka et al.

(10) Patent No.: US 6,951,047 B2
(45) Date of Patent: Oct. 4, 2005

(54) METHOD OF MANUFACTURING A SURFACE ACOUSTIC WAVE ELEMENT

(75) Inventors: Muneko Tomioka, Osaka (JP); Kiyoharu Yamashita, Osaka (JP); Mitsuhiro Furukawa, Hyogo (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/629,633

(22) Filed: Jul. 30, 2003

(65) Prior Publication Data
US 2005/0035830 A1 Feb. 17, 2005

(30) Foreign Application Priority Data
Jul. 31, 2002 (JP) .................................... 2002-222792

(51) Int. Cl.[7] .................. H04R 17/00; H01L 41/04; H01L 41/08; H01L 41/18; H02N 2/00
(52) U.S. Cl. .................. 29/25.35; 29/415; 29/417; 29/594; 29/595; 29/831; 29/840; 29/847; 310/313 D
(58) Field of Search .................. 29/25.35, 594, 29/595, 415, 417, 831, 840, 847; 156/250, 257; 310/313 D, 313 B, 348

(56) References Cited

U.S. PATENT DOCUMENTS

| | | | | |
|---|---|---|---|---|
| 5,184,042 A | * | 2/1993 | Kadota et al. | 310/313 A |
| 5,243,249 A | * | 9/1993 | Miyashita et al. | 310/313 B |
| 5,325,573 A | * | 7/1994 | Miyashita et al. | 29/25.35 |
| 5,701,645 A | * | 12/1997 | Allen et al. | 29/25.35 |
| 5,771,556 A | * | 6/1998 | Allen et al. | 29/25.35 |
| 6,034,578 A | | 3/2000 | Fujita et al. | |

FOREIGN PATENT DOCUMENTS

| | | |
|---|---|---|
| JP | 03293808 | 12/1991 |
| JP | 2000013165 | 1/2000 |

* cited by examiner

Primary Examiner—A. Dexter Tugbang
Assistant Examiner—Tai Van Nguyen
(74) Attorney, Agent, or Firm—Wenderoth, Lind & Ponack, L.L.P.

(57) ABSTRACT

A SAW element of the present invention includes a plurality of inter-digital transducer (IDT) electrodes on a piezoelectric substrate, grating reflector electrodes disposed on the sides of the IDT electrodes, and a plurality of pad electrodes led from the IDT electrodes and the grating reflector electrodes. A plurality of the pad electrodes includes isolated pad electrodes not directly opposed to the outer periphery of the SAW element, and adjacent pad electrodes directly opposed to the outer periphery thereof A connecting electrode between the isolated pad electrode and the adjacent pad electrode is removed by etching at least before dicing in order to prevent discharge from occurring due to pyroelectricity, and to prevent the electrodes from being damaged.

8 Claims, 10 Drawing Sheets

METHOD OF MANUFACTURING A SURFACE ACOUSTIC WAVE ELEMENT

FIELD OF THE INVENTION

The present invention relates to a surface acoustic wave device (hereinafter called a SAW device) and a surface acoustic wave element (hereinafter called a SAW element) used in the SAW device for communication equipment, and manufacturing methods thereof

BACKGROUND OF THE INVENTION

A conventional SAW device is generally manufactured by the following method. As a piezoelectric substrate, for example, a lithium tantalate (LiTaO3) single crystal substrate is used. A metal film of aluminum (Al) or the like is formed on the piezoelectric substrate, and an inter digital transducer electrode (hereafter called IDT electrode) and a grating reflector electrode are formed by photolithography and an etching process. In this way, after forming several SAW elements on the piezoelectric substrate, the substrate is diced into individual pieces. A SAW device is manufactured by mounting individual SAW elements on a ceramic package or the like. Here, the connection of the SAW element and the package pad is often made by wire bonding or flip chip bonding. In order to improve the reliability of the connection, a reinforcing electrode is further formed as needed on the pad electrode of the SAW element. Also, in the case of flip chip bonding, it is necessary to further form a bump on the reinforcing electrode.

FIG. 8 is a plan view of a conventional SAW element formed on a piezoelectric substrate. In FIG. 8, the element is shown as being formed on a piezoelectric substrate before dicing. Thus, only one SAW element is shown surrounded by a dicing line.

As piezoelectric substrate 1, a single crystal substrate such as LiTaO3 single crystal substrate or lithium nyobate (LiNbO3) single crystal substrate is used. Dicing line 2 made of Al or the like is formed on the piezoelectric substrate 1, and the SAW element is formed inside the dicing line 2. In this example, the SAW element is composed of three IDT electrodes 31, 32, 33, and two grating reflector electrodes 41, 42 disposed on either side thereof. At the input side of the outside IDT electrodes 31, 33, a ground terminal 5 and pad electrode 61 connected to the ground terminal 5 are positioned. Also, at the input side of the middle IDT electrode 32, input terminal 8 and pad electrode 62 connected to the input terminal 8 are positioned. The pad electrode 62 is surrounded by the ground terminal 5 and the pad electrode 61. Further, pad electrodes 61, 63, 64, 65, 66, 67 (not pad electrode 62) are provided with short-circuit electrode 7 connected to the dicing line 2. Here, bump 21 is formed on each of the pad electrodes 61, 62, 63, 64, 65, 66, 67.

By using such a configuration, the potential of electric charge generated on the piezoelectric substrate 1 during the manufacturing process can be made uniform by the electrodes connected to the dicing line 2, and it becomes possible to prevent a discharge from occurring between the IDT electrodes 31, 32, 33. In the case of a SAW element, dicing on the dicing line 2 causes the dicing line 2 to disappear, and the IDT electrodes 31, 32, 33 can be electrically freed.

In the SAW element manufacturing process, heat is often applied to the piezoelectric substrate during IDT electrode and grating reflector electrode or reinforcing electrode forming, as well as photolithography, etching or the like. Consequently, an electric charge generated on the piezoelectric substrate due to the pyroelectric effect of the piezoelectric substrate is accumulated. When the accumulated charge exceeds a certain level, discharge takes place between the electrodes, such as the IDT electrodes, causing the electrode pattern to be damaged and deteriorated in characteristics.

However, in the conventional configuration shown in FIG. 8, since the input terminal 8 and the pad electrode 62 are surrounded by the ground terminal 5 and the pad terminal 61, it is not possible to provide a connection electrode between pad electrode 62 and the dicing line 2. Accordingly, input terminal 8 and pad electrode 62 are kept electrically free, and discharge takes place due to the electric charge generated at IDT electrode 32, causing the electrode pattern to be damaged. An IDT electrode with a pad electrode that cannot be connected to a dicing line often exists not only in a SAW element configuration as shown in FIG. 8, but also in other element configurations.

As a means to solve this problem, a method disclosed in Japanese Laid-open Patent H3-293808 is known. In that method, the IDT electrode to be freed (as shown in FIG. 8) is configured so that the outermost electrode finger of the IDT electrode is connected to the electrode finger of an adjacent IDT electrode. Since the pad electrode connected to the adjacent IDT electrode is connected to the dicing line by a connecting line, there is no IDT electrode to be electrically freed as shown in FIG. 8. As a result, discharge can be prevented from occurring between IDT electrodes. However, in this method, even if a SAW element is employed, the IDT electrode to be freed has to be configured so that the electrode finger thereof is kept electrically connected to the electrode finger of an adjacent IDT electrode. Therefore, it becomes difficult to design so as to achieve the intended filter function for a SAW device. Further, since the IDT electrode finger is not wide enough and the impedance is great, the potential cannot be made sufficiently uniform, sometimes causing discharge to take place when a big electric charge is generated.

SUMMARY OF THE INVENTION

The present invention is intended to solve the above problem, and the object of the invention is to provide a SAW device and its manufacturing method, wherein no electrode is allowed to become electrically freed during the manufacturing processes, especially up to a step in which discharge is liable to take place due to an accumulation of electric charge. As a result, an electric charge generated on the piezoelectric substrate is made uniform to prevent discharge from occurring and the electrodes from being damaged.

The SAW element of the present invention is a surface acoustic wave element comprising a piezoelectric substrate and a plurality of IDT electrodes on the piezoelectric substrate. Grating reflector electrodes are disposed on either side of the IDT elctrodes, and a plurality of pad electrodes lead from the IDT electrodes and from the grating reflector electrodes. Pad reinforcing electrodes are formed on a plurality of the pad electrodes. A group of the pad electrodes include isolated pad electrodes not directly opposed to the outer periphery of the SAW element, and include adjacent pad electrodes directly opposed to the outer periphery thereof. At least a part of a connecting electrode is formed between the isolated pad electrode and the adjacent pad electrode.

Also, the SAW element manufacturing method of the present invention includes forming a plurality of SAW elements including a plurality of IDT electrodes on a piezoelectric substrate. Grating reflector electrodes are disposed on either side of the IDT electrodes, and a plurality of pad electrodes lead from the IDT electrodes and from the grating reflector electrodes. Dicing lines are formed on each outer periphery of the SAW element, and connecting electrodes are formed to connect isolated electrodes (which cannot be directly connected to the dicing line out of the pad electrodes) to adjacent pad electrodes (which can be directly connected to the dicing line). Short-circuit electrodes are formed to connect adjacent pad electrodes to the dicing line. Pad reinforcing electrodes are formed on the pad electrodes, and bumps are formed on the pad reinforcing electrodes. At least a part of the connecting electrodes are removed to make the isolated pad electrode and the adjacent pad electrode electrically freed from each other. The dicing line and the piezoelectric substrate are also cut off by a width greater than the width of the dicing line on the dicing line.

As described above, according to the present invention, all the electrode patterns are directly and indirectly connected by using connecting electrodes and short-circuit electrodes, thereby not allowing any electrodes to be electrically freed. In this way, the potential for electric charge to be generated on the piezoelectric substrate is made uniform over the entire piezoelectric substrate, making it free from potential difference, and it is also possible to prevent the electrodes from being damaged by static discharge and the like.

DETAILED DESCRIPTION OF THE INVENTION

The exemplary embodiments of the present invention will be described in the following with reference to the drawings. Incidentally, like numerals refer to like component parts throughout.

First Exemplary Embodiment

Figure 1:
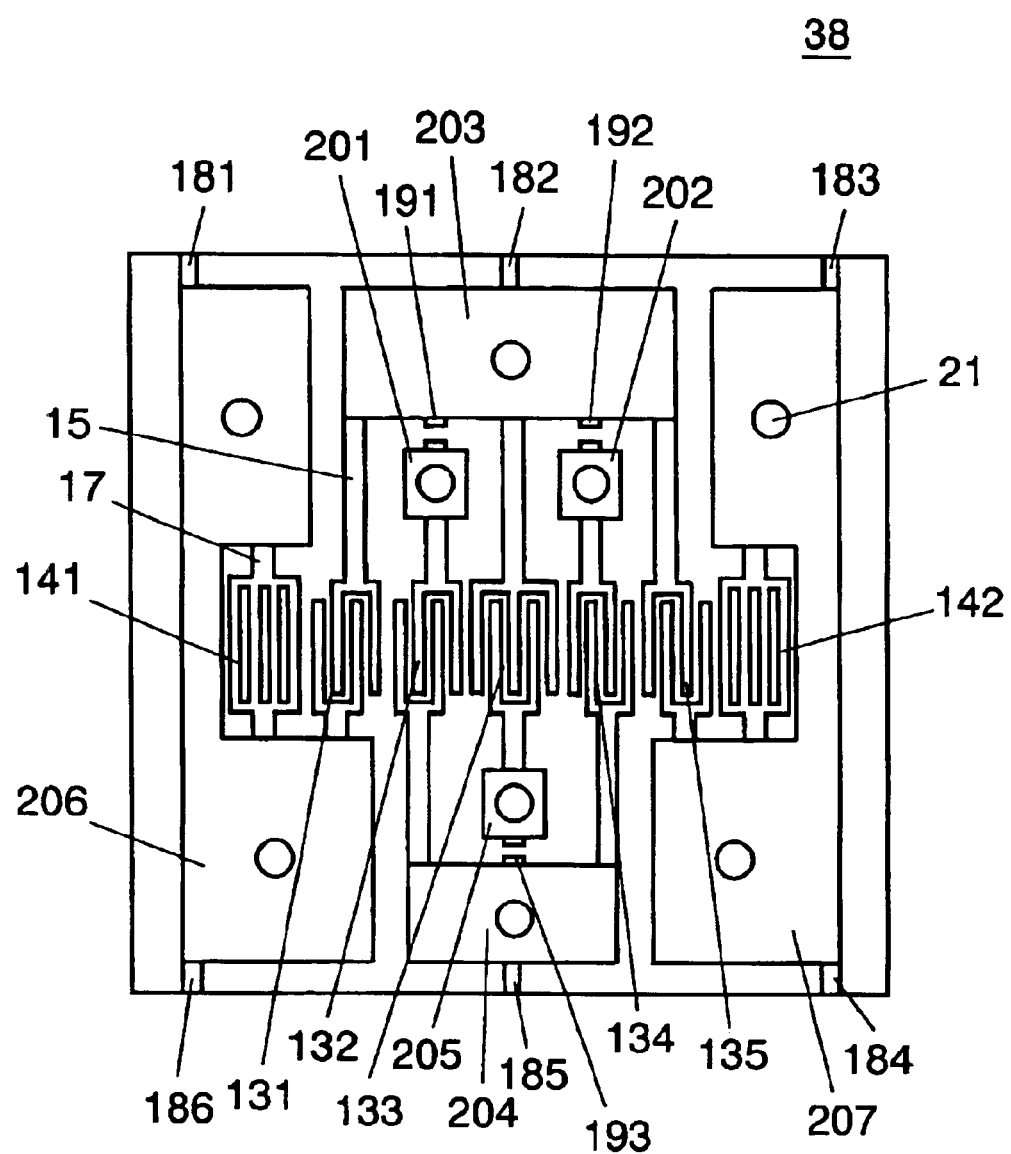
FIG. 1 is a plan view showing the shape of a SAW element in a first exemplary embodiment of the present invention.

FIG. 1 is a plan view showing an individual piece of a diced piezoelectric substrate having an electrode pattern configuration of a SAW element in a first exemplary embodiment of the present invention.

A metal film, such as a single layer of Al, Al-alloy or titanium (Ti), or a laminated layer of these, is formed on piezoelectric substrate 11 made up of LiTaO3 single crystal substrate or the like. A SAW element including a predetermined IDT electrode, grating reflector electrodes on either side of the IDT electrode, and pad electrodes led from the grating reflector electrodes is formed through a photolithography process and an etching process.

In the first exemplary embodiment, IDT electrodes including outer IDT electrodes 131, 135, inner IDT electrodes 132, 134, and central IDT electrode 133 are formed. Also, terminal electrodes 15 lead from each of these electrodes.

The outer IDT electrodes 131, 135 are each connected at respective first sides thereof to pad electrodes (not shown) via terminal electrodes 15 and to pad reinforcing electrode 203 formed on the pad electrodes. Also, the outer IDT electrodes 131, 135 are each connected at respective second sides thereof to pad electrodes (not shown) via terminal electrodes 15 and to pad reinforcing electrodes 206, 207 formed on the pad electrodes.

The inner IDT electrodes 132, 134 are each connected at respective first sides thereof to pad electrodes (not shown) via terminal electrodes 15 and to pad reinforcing electrodes 201, 202 formed on the pad electrodes. Also, the inner IDT electrodes 132, 134 are each connected at respective second sides thereof to pad electrodes (not shown) via terminal electrodes 15 and to a pad reinforcing electrode 204 formed on the pad electrodes.

The central IDT electrode 133 is connected at a first side thereof to a pad electrode (not shown) via terminal electrode 15 and to the pad reinforcing electrode 203 formed on the pad electrode. Here, the outer IDT electrodes 131, 135 are also connected at their respective first sides to the pad reinforcing electrode 203 via terminal electrodes 15. Also, the central IDT electrode 133 is connected at a second side thereof to a pad electrode (not shown) via terminal electrode 15 and to pad reinforcing electrode 205 formed on the pad electrode.

Grating reflector electrodes 141, 142 are each connected to pad electrodes (not shown) and to the pad reinforcing electrodes 206, 207 formed on the pad electrodes via lead electrodes 17 disposed on each side of each grating reflector electrode. Here, IDT electrodes 131, 135 are each also connected at their respective second sides to the pad reinforcing electrodes 206, 207 via terminal electrodes 15.

Also, at least one bump 21 is formed on each pad reinforcing electrode 201, 202, 203, 204, 205, 206, 207. Particularly, two bumps 21 are formed on each of the large pad reinforcing electrodes 206, 207 at their ends. Each bump 21 can be formed as a wire bump by using gold (Au) plated or Au wire.

As described above, the electrode pattern configuration includes electrodes necessary for a SAW element. Further, the SAW element of the present exemplary embodiment has additional electrodes in order to prevent discharge from occurring due to electric charge generated by a pyroelectric effect during the manufacturing process, as explained below.

Specifically, from the pad reinforcing electrodes 203, 204, 206, 207 extend short-circuit electrodes 181, 182, 183, 184, 185, 186 connected to the dicing line. Before the SAW element is diced into individual pieces, the electric charge is not biased because the short-circuit electrodes 181, 182, 183, 184, 185, 186 are connected to the dicing line, and the IDT electrodes can be prevented from being damaged by discharge. In the dicing process at the final stage of the manufacturing process, by cutting the piezoelectric substrate along each dicing line, the short-circuit electrodes 181, 182, 183, 184, 185, 186 can be electrically freed (disconnected) as shown in FIG. 1.

Also, the pad reinforcing electrodes 201, 202, 205 are connected by the connecting electrodes 191, 192, 193, respectively, to the pad reinforcing electrodes 203, 204 until completion of a process in which pyroelectricity is especially liable to be generated during the manufacturing process. After the end of the process, the connecting electrodes 191, 192, 193 are partially etched to be electrically freed (disconnected) from the pad reinforcing electrodes 203, 204, as shown in FIG. 1.

By configuring the SAW element in such a manner, it is possible to prevent the IDT electrodes from being damaged by discharge due to pyroelectricity, and to manufacture a SAW element with excellent characteristics and high yield.

Figure 2:
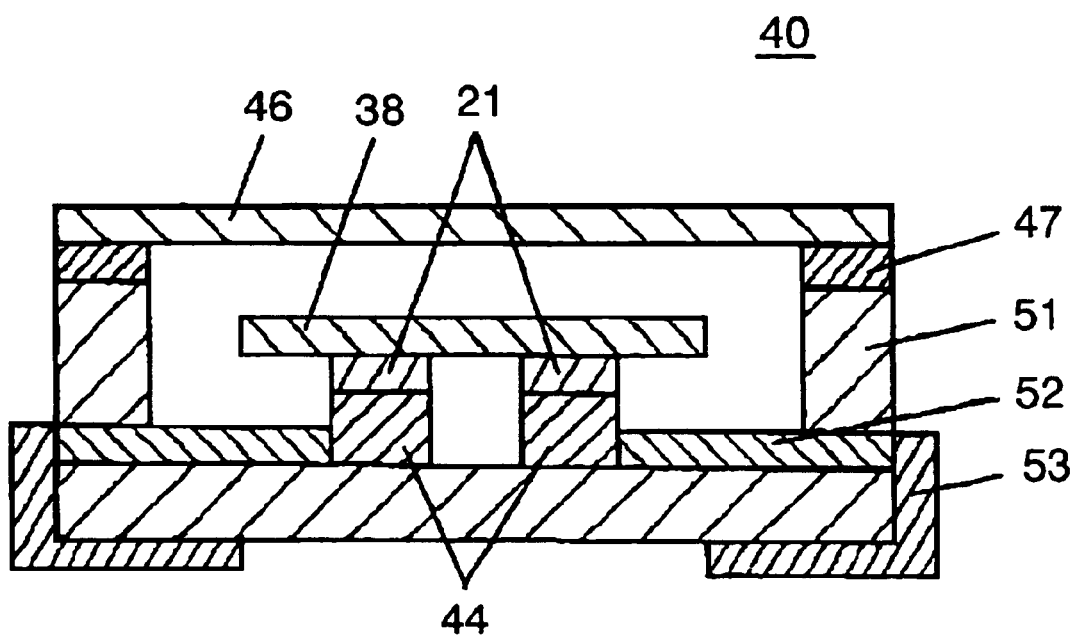
FIG. 2 is a sectional view of the SAW element in a SAW device in the first exemplary embodiment.

FIG. 2 is a sectional view of SAW element 38 produced as explained above, and shown in a packaged state as SAW device 40. In FIG. 2, box-like base member 51 is provided with wiring conductor 52 arranged so as to extend through the side wall of base member 51 at the bottom of the box. Further, connecting terminal electrode 53 is connected to the wiring conductor 52 and is formed from the side wall to the outside bottom. Also, connecting pad electrode 44 is formed in such a manner as to connect with the wiring conductor 52 at the central region of the base member 51.

By connecting bump 21 formed on the SAW element 38 to the connecting pad electrode 44 by using, for example, conductive adhesive bondings or supersonic bonding, the SAW element 38 can be electrically and mechanically connected and fixed to the base member 51.

After that, the base member 51 with the SAW element 38 mounted thereon and cover 46 with connecting member 47 previously fixed thereon are arranged so the connecting member 47 is opposed to the peripheral portion of the box-like base member 51, and the components are then heated by using a sealing apparatus. With sealing completed in this way, the SAW device 40 is formed. As the connecting member 47, for example, Au—Sn solder or solder can be used.

Also, as the manufacturing method for SAW device 40, besides the above method, it is preferable to employ other methods as needed. For example, a method of electrically connecting the SAW element 38 and the connecting pad electrode 44 by means of wire bonding can be used.

The manufacturing process will be specifically described in the following by using FIG. 3A to FIG. 3E and FIG. 4A to FIG. 4E.

Figure 3A:
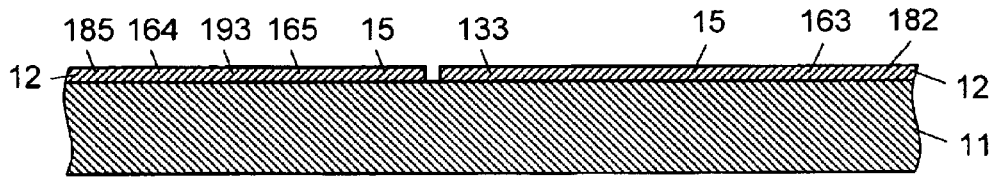
FIG. 3A is a sectional view showing a SAW element pattern formed on a piezoelectric substrate in the manufacturing method of the first exemplary embodiment.
Figure 3B:
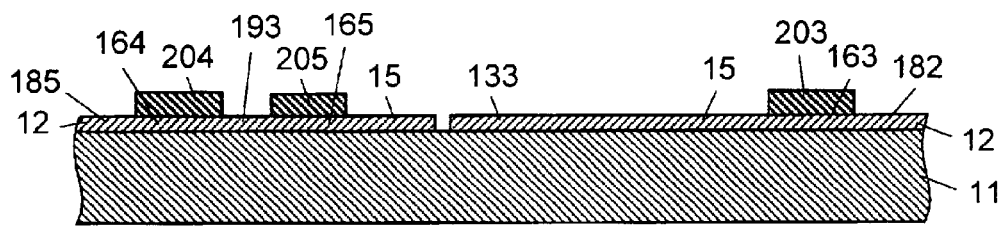
FIG. 3B is a sectional view showing pad reinforcing electrodes formed on pad electrodes in the manufacturing method of the first exemplary embodiment.
Figure 3C:
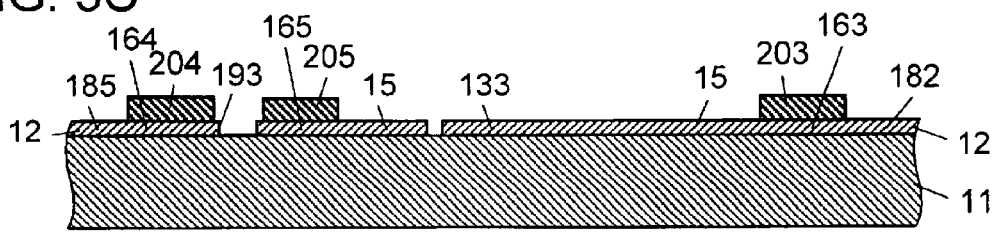
FIG. 3C is a sectional view showing an etched state of a connecting electrode formed between an isolated pad electrode and an adjacent pad electrode in the manufacturing method the first exemplary embodiment.
Figure 3D:
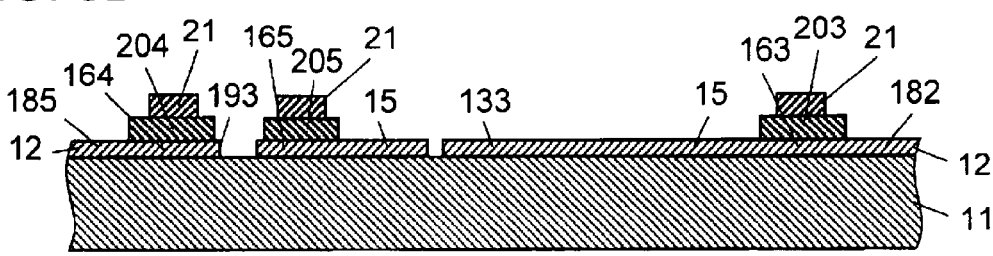
FIG. 3D is a sectional view showing bumps formed on pad reinforcing electrodes in the manufacturing method of the first exemplary embodiment.
Figure 3E:
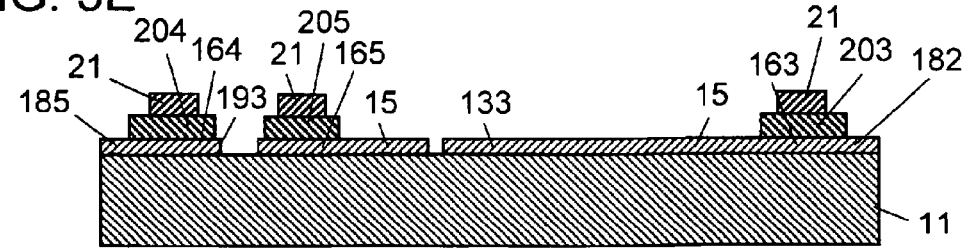
FIG. 3E is a sectional view showing a SAW element diced by a dicing saw into individual pieces in the manufacturing method of the first exemplary embodiment.
Figure 4A:
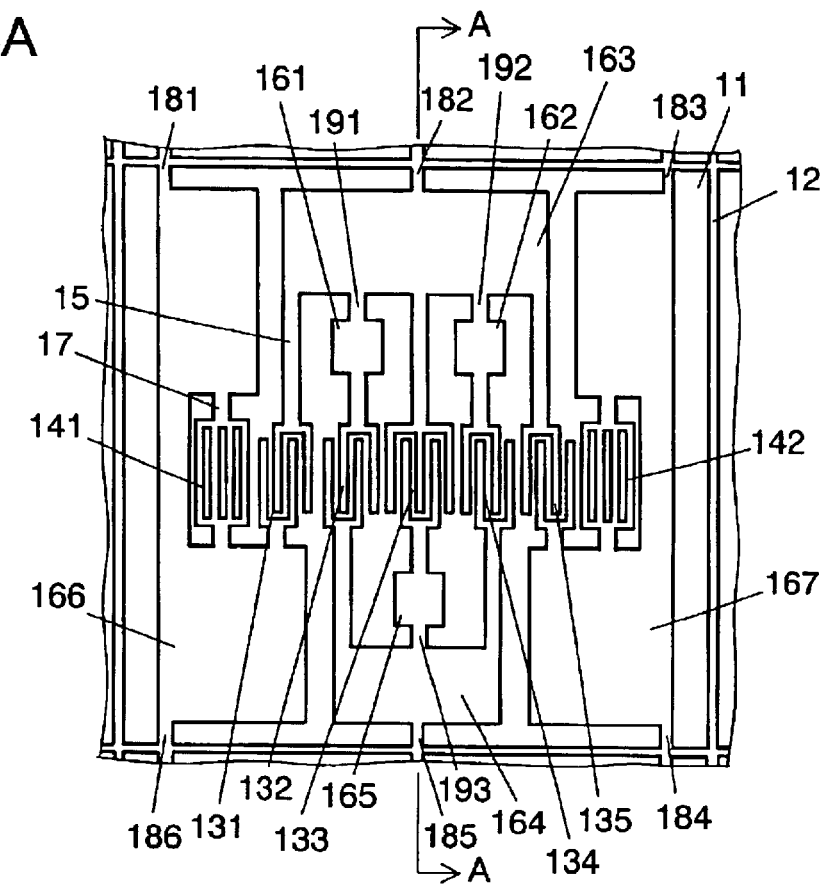
FIG. 4A is a plan view showing a SAW element pattern formed on a piezoelectric substrate in the manufacturing method of the first exemplary embodiment.

FIG. 3A to FIG. 3E are sectional views describing the process of manufacturing SAW element 38 in the first exemplary embodiment. Also, FIG. 4A to FIG. 4E are plan views corresponding to FIG. 3A to FIG. 3E. The sectional views of FIG. 3A to FIG. 3E are sectional views along the A—A line shown in FIG. 4A. Actually, a plurality of SAW elements are formed together on a piezoelectric substrate, but in these figures, only one SAW element surrounded by the dicing line is shown. Also, FIG. 3E and FIG. 4E show the one SAW element diced into individual pieces.

First, a metal film of Ti, Al or Al alloy is formed on piezoelectric substrate 11 formed of LiTaO3 single crystal substrate or the like by, for example, a sputtering process. The metal film preferably has a single layer or laminated layer configuration as needed. For example, the electric power resistance of an IDT electrode can be greatly improved by laminating a Ti layer and an Al alloy layer. The present invention also preferably adopts such an electrode configuration.

Next, a photoresist is coated on the metal film. After being exposed by a mask with a specified shape, the photoresist is etched by a dry etching apparatus or the like to form a SAW element pattern as shown in FIG. 3A and FIG. 4A.

The outer IDT electrodes 131, 135 are each connected at a respective first side thereof to adjacent pad electrode 163 via respective terminal electrodes 15. Also, the second side of each of the outer IDT electrodes 131, 135 is connected to respective adjacent pad electrodes 166, 167 via terminal electrode 15.

The inner IDT electrodes 132, 134 are each connected at a respective first side thereof to respective isolated pad electrodes 161, 162 via respective terminal electrodes 15. Also, the second side of each of the inner IDT electrodes 132, 134 is connected in common to adjacent pad electrode 164 via respective terminal electrodes 15.

Further, the central IDT electrode 133 is connected at a first side thereof to adjacent pad electrode 163 via terminal electrode 15. Here, the outer IDT electrodes 131, 135 are also connected at their first sides to the adjacent pad electrode 163 via respective terminal electrodes 15. On the other hand, the central IDT electrode 133 is connected at a second side thereof to isolated pad electrode 165 via terminal electrode 15.

Grating reflector electrodes 141, 142 are each connected to a respective one of adjacent pad electrodes 166, 167 via lead electrodes 17 disposed on either side thereof. Here, the outer IDT electrodes 131, 135 are each connected at their second sides to a respective one of the adjacent pad electrodes 166, 167 via terminal electrode 15.

Further, short-circuit electrodes 181, 182, 183, 184, 185, 186 are led from adjacent pad electrodes 163, 164, 166, 167 and are each connected to the dicing line 12. Also, connecting electrodes 191, 192, 193 are led from isolated pad electrodes 161, 162, 165 and are each connected to a respective one of adjacent pad electrodes 163, 164.

Figure 4B:
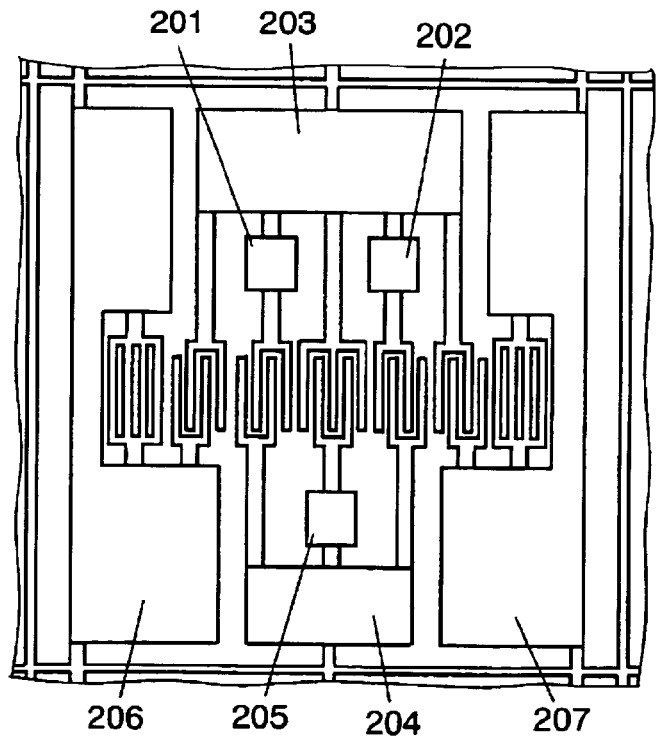
FIG. 4B is a plan view showing pad reinforcing electrodes formed on pad electrodes in the manufacturing method of the first exemplary embodiment.

Next, as shown in FIG. 3B and FIG. 4B, after processing photoresist into a predetermined pattern on the piezoelectric substrate 11, a metal film of Al or the like with a film thickness of about 500 nm is formed by a vacuum evaporation process or a like process, and then unnecessary metal film is lifted off. In this way, pad reinforcing electrodes 201, 202, 203, 204, 205, 206, 207 are formed on respective adjacent pad electrodes 163, 164, 166, 167 and isolated pad electrodes 161, 162, 165. These pad reinforcing electrodes 201, 202, 203, 204, 205, 206, 207 absorb distortion during the formation of bumps in a later process, thereby acting to improve the adhesion of the bumps.

Since the metal film formed for the pad reinforcing electrodes 201, 202, 203, 204, 205, 206, 207 has to be relatively thick, pyroelectricity is generated as the piezoelectric substrate 11 is heated during vacuum evaporation. However, because all the electrode patterns on the piezoelectric substrate 11 are (at this stage) electrically connected to each other via the dicing line 12 and the electric potential is uniform, it is possible to prevent the IDT electrodes and the like from being damaged by discharge.

For the pad reinforcing electrodes 201, 202, 203, 204, 205, 206, 207, it is also preferable to use Au and copper (Cu) or their laminate configuration as well as Al. In this exemplary embodiment, the pad reinforcing electrodes 201, 202, 203, 204, 205, 206, 207 are formed on the entire surface of each of the adjacent pad electrodes 163, 164, 166, 167 and the isolated pad electrodes 161, 162, 164, but it is also preferable to form them only on a part of the surface where bump 21 is formed.

Figure 4C:
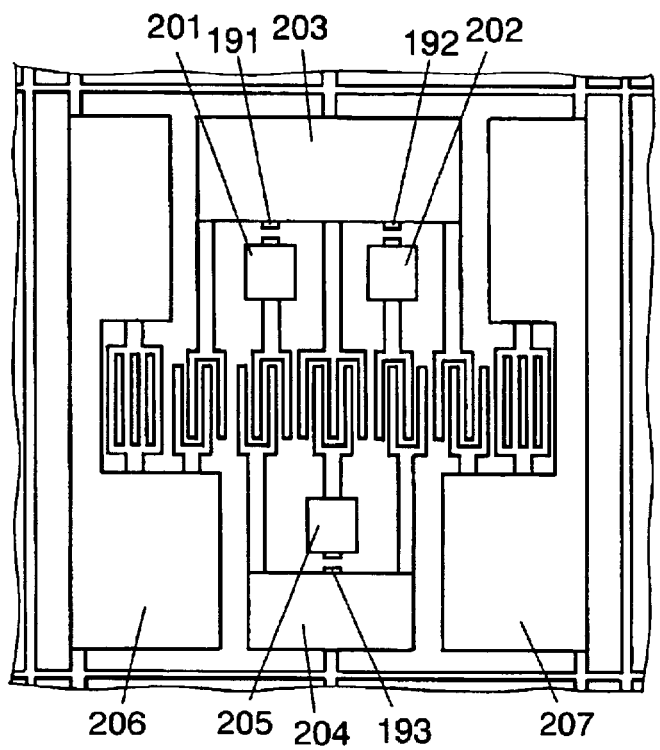
FIG. 4C is a plan view showing an etched state of a connecting electrode formed between an isolated pad electrode and an adjacent pad electrode in the manufacturing method of the first exemplary embodiment.

Next, as shown in FIG. 3C and FIG. 4C, etching is executed on predetermined portions of connecting electrodes 191, 192, 193 on the piezoelectric substrate 11 by a photolithography process and dry etching. Thus, the pad reinforcing electrodes 201, 202, 205 respectively connected to the inner IDT electrodes 132, 134 and central IDT electrode 133 are electrically freed (disconnected) from the pad reinforcing electrodes 203, 204 arranged at the outside of pad reinforcing electrodes 201, 202, 205. In FIG. 3C and FIG. 4C, a part of the connecting electrode is etched, but it is also preferable to etch the entire connecting electrode.

Figure 4D:
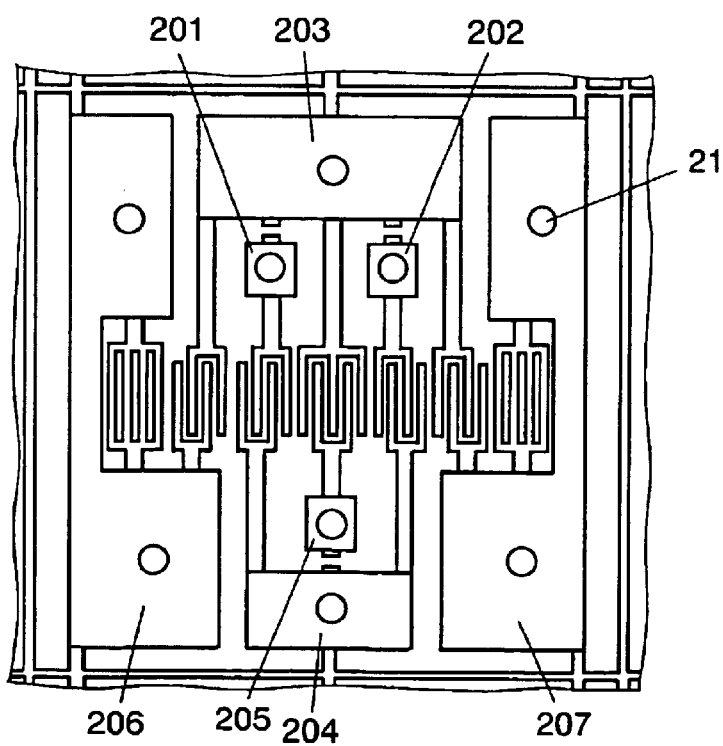
FIG. 4D is a plan view showing bumps formed on pad reinforcing electrodes in the manufacturing method of the first exemplary embodiment.
Figure 4E:
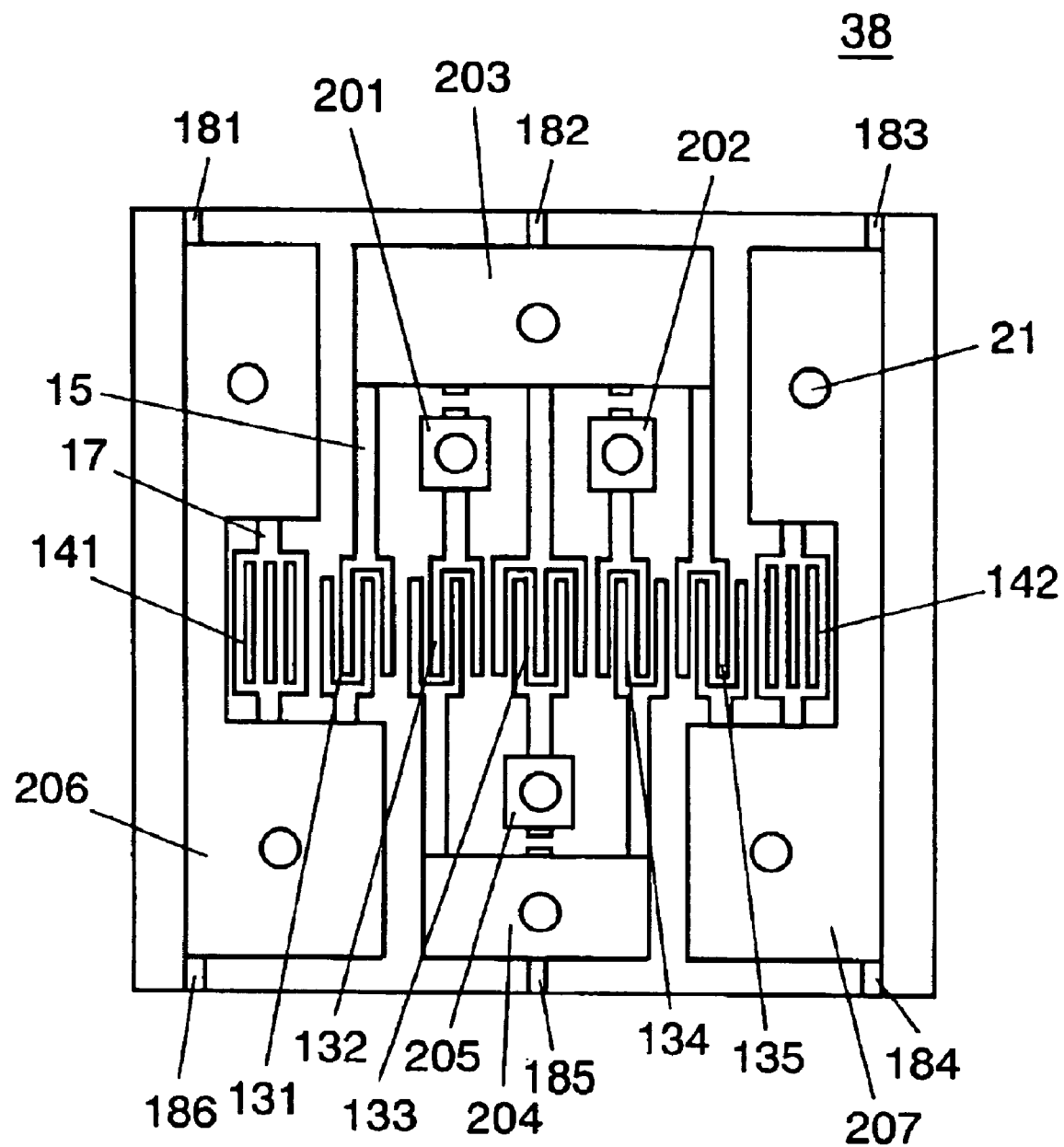
FIG. 4E is a plan view showing a SAW element diced by a dicing saw into individual pieces in the manufacturing method of the first exemplary embodiment.

After that, as shown in FIG. 3D and FIG. 4D, bump 21 made of Au or the like is formed on each of the pad reinforcing electrodes 201, 202, 203, 204, 205, 206, 207. With respect to the large pad reinforcing electrodes 206, 207 at the sides, two bumps 21 are formed on each of those electrodes, but forming one bump or three bumps thereon is also possible. The bump 21 can be formed by a wire bumping method using Au wire or by Au plating.

Next, as shown in FIG. 3E and FIG. 4E, the piezoelectric substrate 11 is diced by a dicing saw or the like into individual SAW elements 38. In this case, by dicing along the dicing line 12 by a width wider than the dicing line 12, the dicing line 12 on the SAW element 38 can be eliminated. Consequently, all of the short-circuit electrodes 181, 182, 183, 184, 185, 186 are electrically freed. Accordingly, the pad reinforcing electrodes 203, 204, 206, 207 connected thereto are also electrically freed. Incidentally, FIG. 4E is the same as FIG. 1.

According to such a manufacturing process, it is possible to obtain a SAW device 40 in which IDT electrodes are hardly damaged and the design of filter characteristics is easy.

In the present exemplary embodiment, the short-circuit electrodes 181, 182, 183, 184, 185, 186 are removed by dicing simultaneously as the piezoelectric substrate 11 is diced, but the present invention is not limited to this. For example, it is possible to remove them by etching simultaneously as the connecting electrodes 191, 192, 193 are etched. In this method, it is also possible to measure the electrical characteristics of the SAW element 38 on the piezoelectric substrate 11 before dicing.

In the present exemplary embodiment, the large adjacent pad electrodes 166, 167 at the sides, and the short-circuit electrodes 181, 183, 184, 186 connected to the pad reinforcing electrodes 206, 207 formed on pad electrodes 166, 167, are each connected to the dicing lines 12 arranged in a parallel fashion. In addition, it is also possible to form a short-circuit electrode connected to the dicing line 12 in a direction vertical to the above mentioned dicing line 12. Also, as to the number of short-circuit electrodes connected, a plurality of electrodes can be disposed at one portion. Also, as to the positions of short-circuit electrodes and connecting electrodes, positions at which electric potential is liable to become high on pad electrodes, such as corner portions, are desirable, but other positions are also possible.

Also, as to the width and thickness of the short-circuit electrodes and connecting electrodes, any width and thickness are possible provided that they exceed at least the width and thickness of the dicing line.

Further, as a method of removing all or a part of the connecting electrodes 191, 192, 193, wet etching can also be employed besides dry etching. Such dry etching and wet etching are capable of processing electrodes with nanometer-order accuracy irrespective of the positions on the piezoelectric substrate 11.

It is also preferable to remove all or a part of the connecting electrodes 191, 192, 193 after forming pad reinforcing electrodes and bumps.

Second Exemplary Embodiment

A second exemplary embodiment of the present invention will be described in the following with reference to the drawings.

FIG. 5A to FIG. 5E are sectional views showing the manufacturing process of a SAW element in the second exemplary embodiment of the present invention. The same elements as shown in FIG. 1 to FIG. 4E are given the same reference numerals.

The difference between the first exemplary embodiment and the second exemplary embodiment with respect to the manufacturing method is that in the second embodiment, the pad reinforcing electrodes 201, 202, 203, 204, 205, 206, 207 are formed, and then, after forming the bump 21, all of the connecting electrodes 191, 192, 193 and all of the short-circuit electrodes 181, 182, 183, 184, 185, 186 are removed. Otherwise, the manufacturing process of the second embodiment is the same as in the first exemplary embodiment.

Figure 5A:
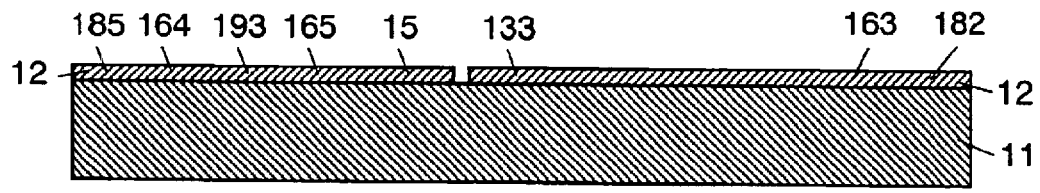
FIG. 5A is a sectional view showing a SAW element pattern formed on a piezoelectric substrate in the manufacturing method of a second exemplary embodiment of the present invention.
Figure 5B:
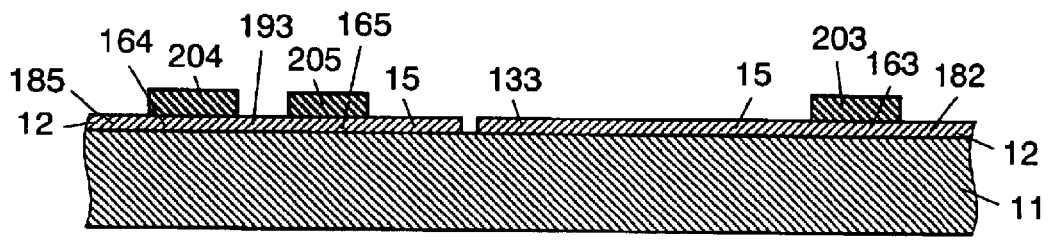
FIG. 5B is a sectional view showing pad reinforcing electrodes formed on pad electrodes in the manufacturing method of the second exemplary embodiment.
Figure 5C:
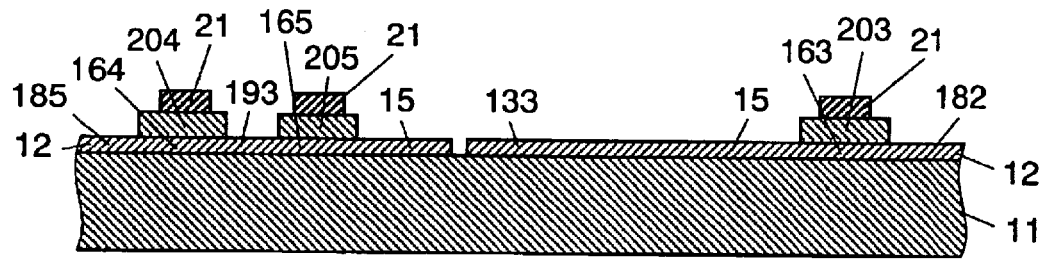
FIG. 5C is a sectional view showing bumps formed on pad reinforcing electrodes in the manufacturing method of the second exemplary embodiment.
Figure 6A:
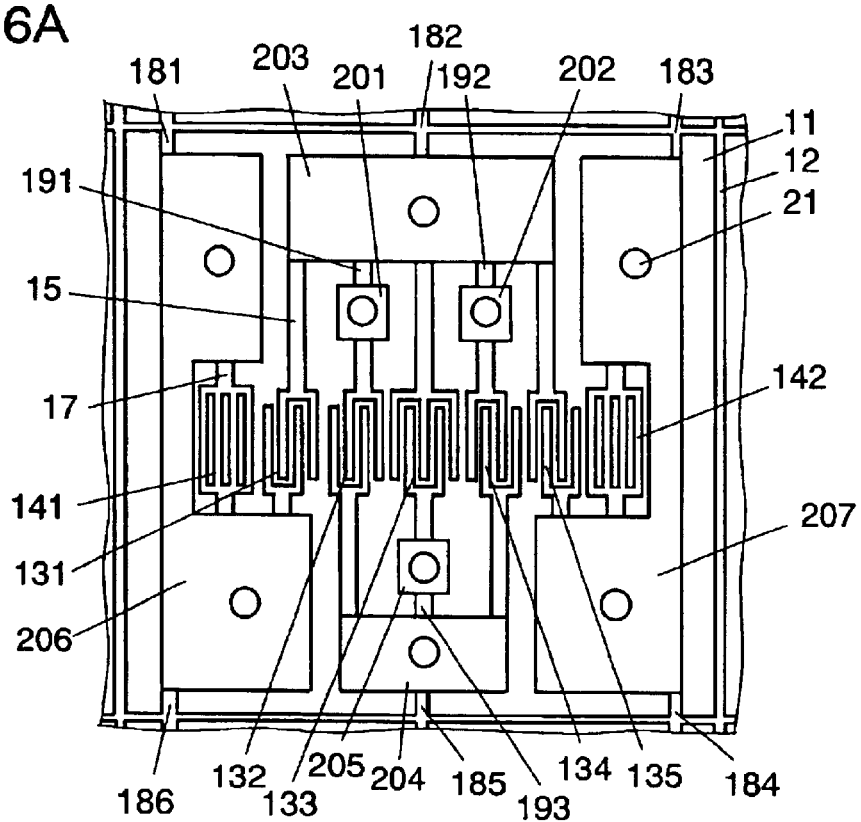
FIG. 6A is a plan view showing bumps formed on pad reinforcing electrodes in the manufacturing method of the second exemplary embodiment.

In other words, in the second exemplary embodiment, FIG. 5A to FIG. 5B is the same as FIG. 3A to FIG. 3B in the first exemplary embodiment. However, as shown in FIG. 5C, the formation of pad reinforcing electrodes 201, 202, 203, 204, 205, 206, 207 is directly followed by the formation of bumps 21. it's the plan view of this configuration is shown in FIG. 6A. As is seen in FIG. 6A and FIG. 5C, even immediately after the bump 21 is formed, the connecting electrodes 191, 192, 193 and the short-circuit electrodes 181, 182, 183, 184, 185, 186 remain unchanged (i.e., still in place).

Figure 5D:
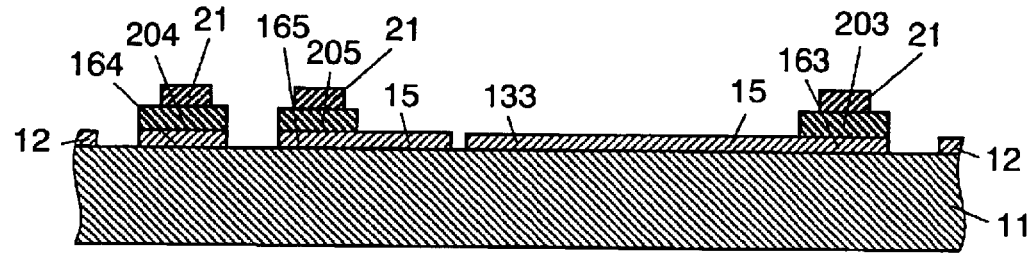
FIG. 5D is a sectional view showing an etched state of a connecting electrode formed between an isolated pad electrode and an adjacent pad electrode, and of a short-circuit electrode formed between an adjacent pad electrode and a dicing line in the manufacturing method of the second exemplary embodiment.
Figure 6B:
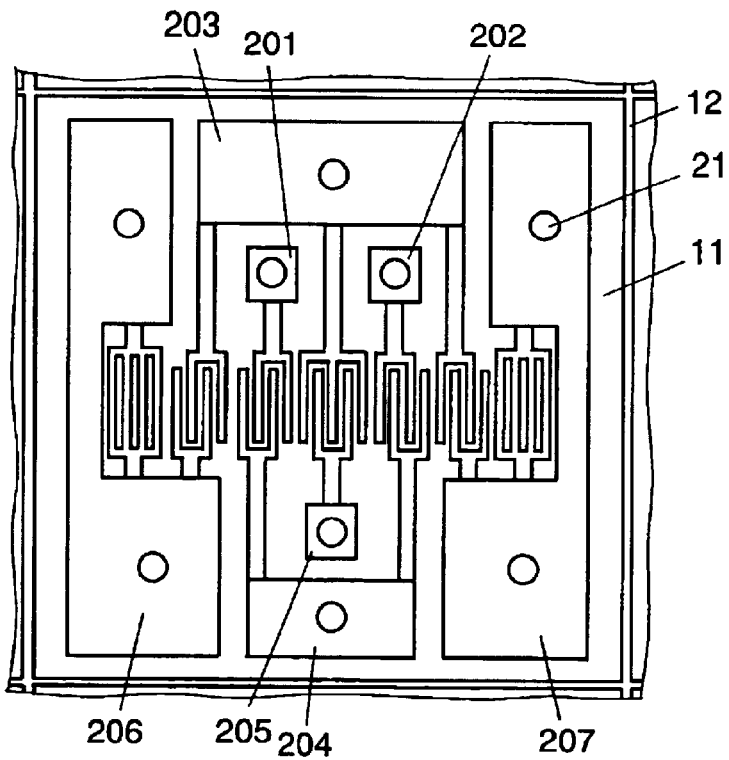
FIG. 6B is a plan view showing an etched state of a connecting electrode formed between an isolated pad electrode and an adjacent pad electrode, and of a short-circuit electrode formed between an adjacent pad electrode and a dicing line in the manufacturing method of the second exemplary embodiment.

Next, as shown in FIG. 5D, all of the connecting electrodes 191, 192, 193 and all of the short-circuit electrodes 181, 182, 183, 184, 185, 186 are simultaneously removed. The plan view of this configuration is shown in FIG. 6B. These electrodes can be removed by an ordinary photolithography process and an etching process, but as described later in this exemplary embodiment, it is also possible to employ a simpler method.

Figure 5E:
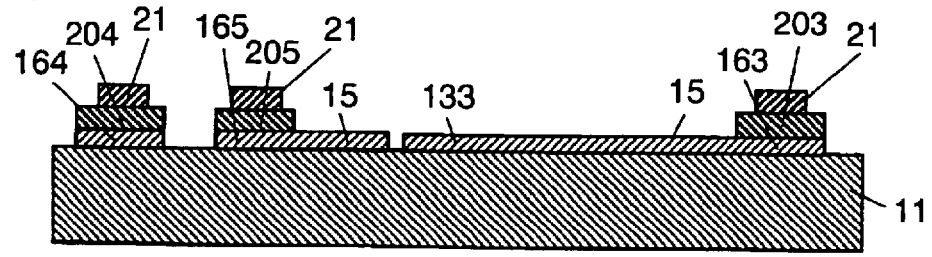
FIG. 5E is a sectional view showing SAW element diced by a dicing saw into individual pieces in the manufacturing method of the second exemplary embodiment.

Subsequently, as shown in FIG. 5E, a SAW element having the same shape as the SAW element in the first exemplary embodiment can be obtained by dicing along the dicing line 12. A SAW device can also be obtained by packaging the SAW element in the same manner as in the first exemplary embodiment. The manufacturing process is the same as in the first exemplary embodiment, and the description is omitted.

When the steps of forming the pad reinforcing electrodes 201, 202, 203, 204, 205, 206, 207, and the bump 21 are completed, the electrodes and patterns necessary for the SAW element are manufactured. Accordingly, even when pyroelectricity is generated on the piezoelectric substrate 11 due to heat applied thereto during the formation of a metal film for IDT electrodes, a pad reinforcing electrode layer, and a metal layer for bumps, the electric potential is uniform because all of the electrodes of the SAW element are electrically connected to each other by the dicing line. Similarly, the electric potential is uniform even when pyroelectricity is generated due to heat in the photolithography process and the etching process for forming the patterns. Accordingly, there will be no damage to the electrodes due to discharge or the like.

A simplified method for removing all of the connecting electrodes 191, 192, 193, and short-circuit electrodes 181, 182, 183, 184, 185, 186 is described in the following. Firstly, a photoresist is coated on the piezoelectric substrate 11, and the photoresist is exposed using a specified photo mask. After that, in the case of developing photoresist, it is developed for a length of time 1.5 times longer than the optimum developing time determined by the thickness of the photoresist. In this way, when the photoresist is developed, the connecting electrodes 191, 192, 193, and short-circuit electrodes 181, 182, 183, 184, 185, 186 located under the photoresist are also etched simultaneously by the developing solution. Accordingly, the photoresist developing and electrode layer etching can be simultaneously performed.

Figure 7A:
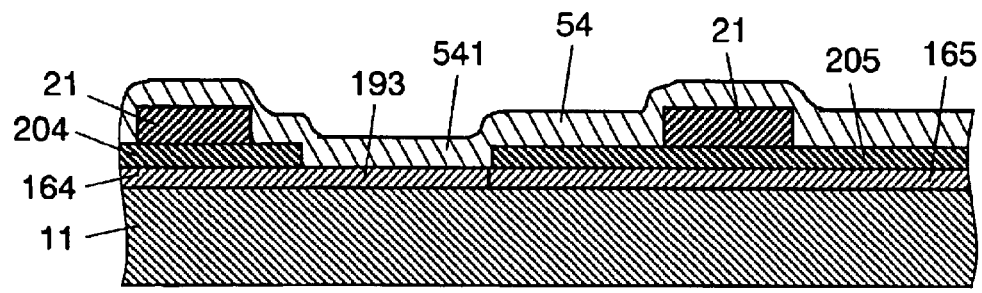
FIG. 7A is a sectional view showing an exposed state of photoresist in a method of etching connecting electrodes simultaneously with developing photoresist as a deformed example of the manufacturing method of the second exemplary embodiment.
Figure 7B:
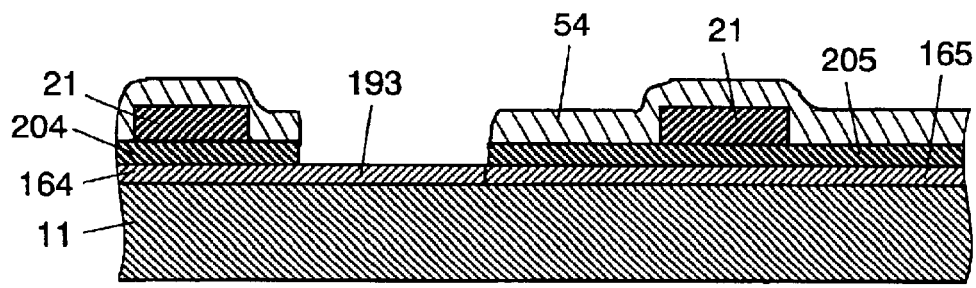
FIG. 7B is a sectional view showing a state in which a photosensitive portion of the photoresist is melted in an optimum developing time in a method of etching connecting electrodes simultaneously with developing photoresist as a deformed example of the manufacturing method of the second exemplary embodiment.
Figure 7C:
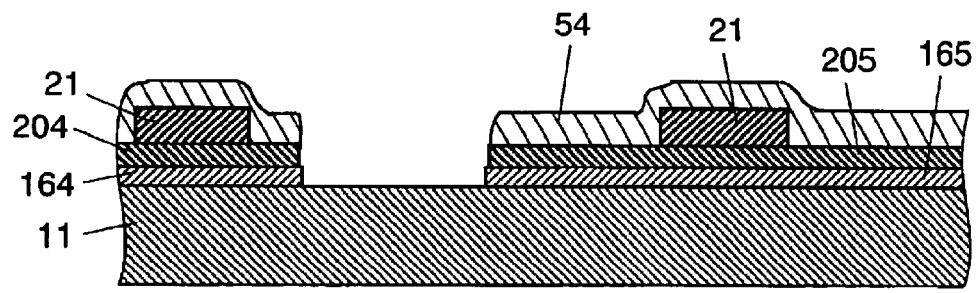
FIG. 7C is a sectional view showing an etched state of a metal film comprising the connecting electrode in a method of etching connecting electrodes simultaneously with developing photoresist as a deformed example of the manufacturing method of the second exemplary embodiment.
Figure 8:
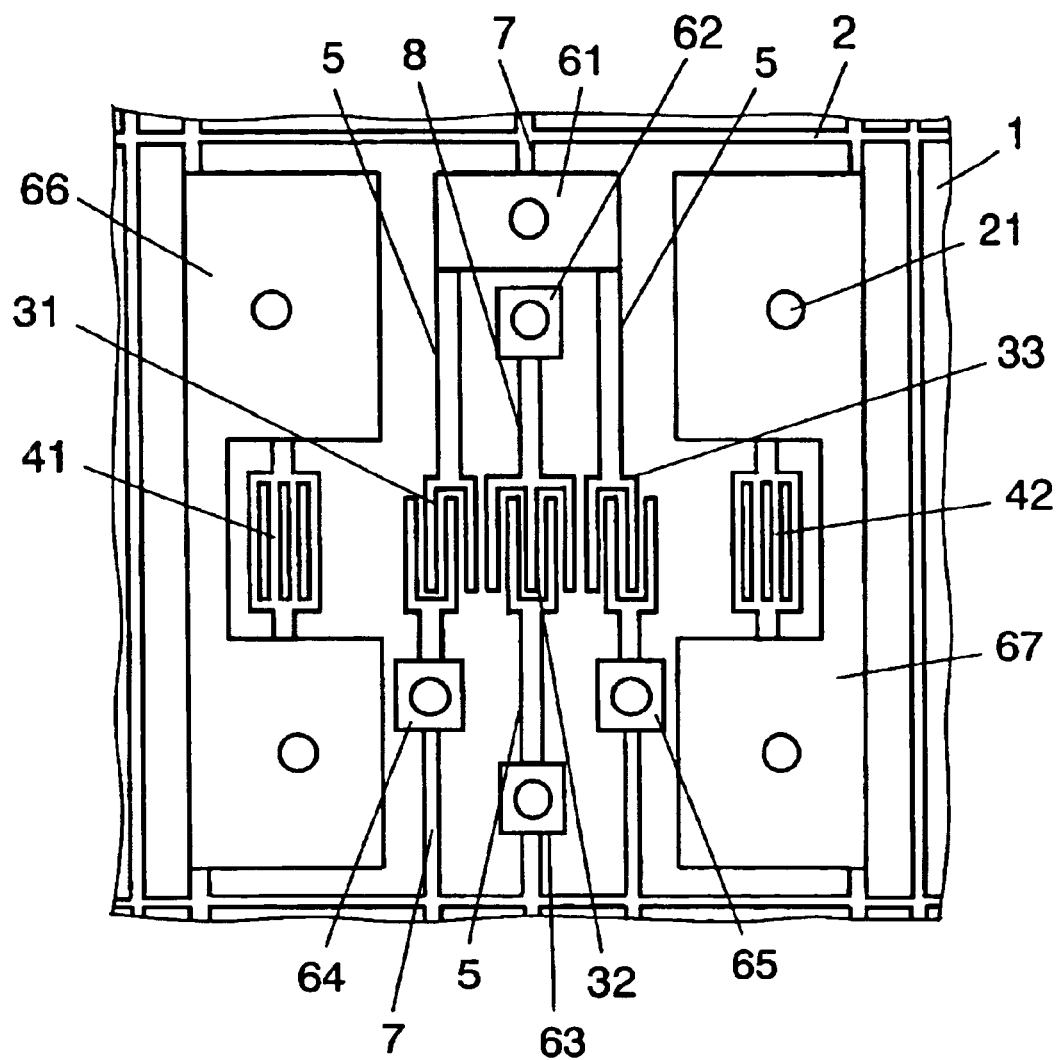
FIG. 8 is a plan view of a conventional SAW element formed on a piezoelectric substrate.

FIG. 7A to FIG. 7C illustrate the method of executing the steps of developing the photoresist and etching the connecting electrodes and short-circuit electrodes at the same time, which are sectional views at a portion near connecting electrode 193 between the two pad reinforcing electrodes 204, 205 shown in FIG. 6A.

FIG. 7A shows the photoresist 54 of the connecting electrode 193 as it is being exposed using a photo mask (not shown). The exposed portion 541 of photoresist 54 is subjected to chemical change, and then becomes soluble in the developing solution. The light-exposed portion 541 cannot be visually recognized because it is merely a latent image, but in FIG. 7A, it is distinguished from other portions for the convenience of description.

The photoresist 54 is developed in this condition. The developing solution is generally an alkaline solution, and the developing time is 1.5 times longer than the optimum developing time. During the optimum developing time, as shown in FIG. 7B, the light-exposed portion 541 of the photoresist 54 is dissolved in the developing solution, causing the metal film forming connecting electrode 193 on the surface to be exposed.

With it continuously immersed in the developing solution, the metal film as the exposed connecting electrode 193, under the light-exposed portion 541 of photoresist 54, is also etched by the developing solution. Accordingly, the steps of developing the photoresist 54 and etching the metal film as the connecting electrode 193 can be continuously executed in the same developing solution. In that case, since the unexposed portion is insoluble in the developing solution, there will be no particular problems even when the optimum developing time is over. The after-etching status is shown in FIG. 7C.

According to the above etching process, the manufacturing process can be simplified because it is not necessary to carry out dry etching or wet etching of the metal film forming the connecting electrode in a separate process.

The etching process is, in most cases, usable for metal film of Al or Al alloy most often used for a SAW e element, although the developing time or the metal film etching time varies. Also, the thinner the metal film, the easier the etching operation becomes. Accordingly, the metal film forming the connecting electrode or the short-circuit electrode is preferably thinner than 1 $\mu$m.

In the present exemplary embodiment, all the connecting electrodes and short-circuit electrodes are etched together with the photoresist. However, it is not always required to execute etching over the entire region because the purpose is just to make them electrically freed (disconnected).

Also, by using the above method after forming pad reinforcing electrodes, it is possible to perform the photoresist developing operation and the connecting electrode and short-circuit electrode etching operation at the same time, which is followed by the bump-forming operation.

Further, in this method, the short-circuit electrode can be electrically freed from the dicing line before execution of the dicing. Accordingly, there will arise no particular problems even when some of the dicing line remains on the piezoelectric substrate during dicing. As a result, rougher dicing is allowable with respect to machining accuracy.

With respect to the manufacturing method for the SAW device of the present invention, it is also preferable to etch all or a part of the connecting electrodes after the step of the forming pad reinforcing electrodes. Thus, the electric potential can be kept uniform even when phyroelectricity is generated on the piezoelectric substrate due to heat generated during the course of forming pad reinforcing electrodes, and it is possible to prevent the IDT electrodes from being damaged in the process.

Also, as to the manufacturing method for the SAW device of the present invention, it is also preferable to etch all or a part of the connecting electrodes after the step of forming bumps. Thus, the electric potential can be kept uniform even when pyroelectricity is generated on the piezoelectric substrate due to heat generated during the course of forming bumps, and it is possible to prevent the IDT electrodes from being damaged in the process.

Further, as to the manufacturing method for the SAW device of the present invention, it is also possible to execute wet etching or dry etching of all or a part of the connecting electrodes. Thus, etching can be performed before dicing because all or a part of the connecting electrodes can be easily etched irrespective of their positions on the piezoelectric substrate. As a connecting electrode removing method, a method of melting by a laser beam or electric current application is also available, but these methods are not desirable because heat is locally generated and pyroelectricity is liable to be produced.

Also, as to the manufacturing method for the SAW device of the present invention, it is also possible to etch all or a part of short-circuit electrodes and connecting electrodes at the same time.

Also, as to the manufacturing method for the SAW device of the present invention, the step of etching all or a part of the short-circuit electrodes and the step of etching all or a part of the connecting electrodes are also preferably identical. Thus, it is possible to simplify the manufacturing process since the etching steps can be made common.

In the first exemplary embodiment and the second exemplary embodiment, the description refers to a configuration with five IDT electrodes and grating reflector electrodes disposed at the sides thereof, but the present invention is not limited to this configuration. That is, it is also possible to include more IDT electrodes or to use a filter configuration that includes a plurality of the above configurations.

DESCRIPTION OF THE REFERENCE NUMERALS 1, 11 Piezoelectric substrate
2, 12 Dicing line
5 Ground terminal
191, 192, 193 Connecting electrode
7, 181, 182, 183, 184, 185, 186 Short-circuit electrode
8 Input terminal
15 Terminal electrode
17 Lead electrode
21 Bump
31, 32, 33 IDT electrode
38 SAW element
40 SAW device
41, 42, 141, 142 Grating reflector electrode
44 Connecting electrode pad
46 Cover
47 Connecting member
51 Base member
52 Wiring conductor
53 Connecting terminal electrode
54 Photoresist
61, 62, 63, 64, 65, 66, 67 Pad electrode
131, 135 Outer IDT electrode
132, 134 Inner IDT electrode
133 Central IDT electrode
161, 162, 165 Isolated pad electrode
163, 164, 166, 167 Adjacent pad electrode
201, 202, 203, 204, 205, 206, 207 Pad reinforcing electrode
541 Exposed portion

We claim:

1. A surface acoustic wave element manufacturing method, comprising:

forming a plurality of surface acoustic wave elements, each of the surface acoustic wave elements including a plurality of inter-digital transducer electrodes on a piezoelectric substrate, a grating reflector electrode arranged on each side of the plurality of inter-digital transducer electrodes, and a plurality of pad electrodes led from the inter-digital transducer electrodes and led from the grating reflector electrodes;

forming dicing lines on an outer periphery of each surface acoustic wave element so that the plurality of pad electrodes of each surface acoustic wave element includes a plurality of isolated pad electrodes electrically isolated from the dicing lines, and includes a plurality of adjacent pad electrodes directly adjacent to at least one of the dicing lines;

forming connecting electrodes for electrically connecting the isolated electrodes to a corresponding one of the adjacent pad electrodes;

forming short-circuit electrodes for electrically connecting the adjacent pad electrodes to at least one of the dicing lines;

forming pad reinforcing electrodes on the pad electrodes;

removing at least a portion of each connecting electrode to electrically disconnect each isolated pad electrode from the corresponding one of the adjacent pad electrodes; and cutting the piezoelectric substrate along the dicing lines;

wherein said removing of at least a portion of each connecting electrode is performed after said forming of the pad reinforcing electrodes.

2. The surface acoustic wave element manufacturing method of claim 1, further comprising forming bumps on the pad reinforcing electrodes.

3. The surface acoustic wave element manufacturing method of claim 2, wherein said removing of at least a portion of each connecting electrode is performed after said forming of the bumps.

4. The surface acoustic wave element manufacturing method of claim 1, wherein said cutting of the piezoelectric substrate comprises dicing the piezoelectric substrate along the dicing lines so that the cut has a width greater than the width of the dicing line.

5. The surface acoustic wave element manufacturing method of claim 1, wherein each connecting electrode comprises a metal film soluble in a developing solution for photoresist; said removing of at least a portion of the connecting electrode comprises:

coating a photoresist on the piezoelectric substrate;

exposing the photoresist so as to make a portion of the photoresist corresponding to at least a portion of each connecting electrode soluble in the developing solution;

developing the photoresist in the developing solution; and etching the at least a portion of each connecting electrode in the developing solution simultaneously with said developing.

6. The surface acoustic wave element manufacturing method of claim 1, further comprising etching at least a portion of each of the short-circuit electrodes so as to electrically disconnect each adjacent pad electrode from the dicing lines, wherein a process for performing said removing of at least a portion of each connecting electrode is identical to a process for performing said etching of at least a portion of each short-circuit electrode.

7. A surface acoustic wave element manufacturing method, comprising:

forming a plurality of surface acoustic wave elements, each of the surface acoustic wave elements including a plurality of inter-digital transducer electrodes on a piezoelectric substrate, a grating reflector electrode arranged on each side of the plurality of inter-digital transducer electrodes, and a plurality of pad electrodes led from the inter-digital transducer electrodes and led from the grating reflector electrodes;

forming dicing lines on an outer periphery of each surface acoustic wave element so that the plurality of pad electrodes of each surface acoustic wave element includes a plurality of isolated pad electrodes electrically isolated from the dicing lines, and includes a plurality of adjacent pad electrodes directly adjacent to at least one of the dicing lines;

forming connecting electrodes for electrically connecting the isolated electrodes to a corresponding one of the adjacent pad electrodes;

forming short-circuit electrodes for electrically connecting the adjacent pad electrodes to at least one of the dicing lines;

forming pad reinforcing electrodes on the pad electrodes;

removing at least a portion of each connecting electrode to electrically disconnect each isolated pad electrode from the corresponding one of the adjacent pad electrodes; and cutting the piezoelectric substrate alone the dicing lines;

wherein said removing of at least a portion of each connecting electrode comprises at least one of wet etching and dry etching.

8. A surface acoustic wave element manufacturing method, comprising:

forming a plurality of surface acoustic wave elements, each of the surface acoustic wave elements including a plurality of inter-digital transducer electrodes on a piezoelectric substrate, a grating reflector electrode arranged on each side of the plurality of inter-digital transducer electrodes, and a plurality of pad electrodes led from the inter-digital transducer electrodes and led from the grating reflector electrodes;

forming dicing lines on an outer periphery of each surface acoustic wave element so that the plurality of pad electrodes of each surface acoustic wave element includes a plurality of isolated pad electrodes electrically isolated from the dicing lines, and includes a plurality of adjacent pad electrodes directly adjacent to at least one of the dicing lines;

forming connecting electrodes for electrically connecting the isolated electrodes to a corresponding one of the adjacent pad electrodes;

forming short-circuit electrodes for electrically connecting the adjacent pad electrodes to at least one of the dicing lines;

forming pad reinforcing electrodes on the pad electrodes;

removing at least a portion of each connecting electrode to electrically disconnect each isolated pad electrode from the corresponding one of the adjacent pad electrodes; and cutting the piezoelectric substrate along the dicing lines;

wherein said removing of at least a portion of each connecting electrode includes simultaneously etching at least a portion of each short-circuit electrode to electrically disconnect each adjacent pad electrode from the dicing lines.

* * * * *